US009753067B2

(12) United States Patent
Deng

(10) Patent No.: US 9,753,067 B2
(45) Date of Patent: Sep. 5, 2017

(54) DETERMINING A PHASE AND A FREQUENCY OF AN ELECTRIC QUANTITY OF AN OPERATING ELECTRICAL DEVICE

(71) Applicant: SIEMENS AKTIENGESELLSCHAFT, München (DE)

(72) Inventor: Heng Deng, Brande (DK)

(73) Assignee: SIEMENS AKTIENGESELLSCHAFT (DE)

( * ) Notice: Subject to any disclaimer, the term of this patent is extended or adjusted under 35 U.S.C. 154(b) by 480 days.

(21) Appl. No.: 14/359,585

(22) PCT Filed: Feb. 1, 2013

(86) PCT No.: PCT/EP2013/052066
§ 371 (c)(1),
(2) Date: May 21, 2014

(87) PCT Pub. No.: WO2013/113891
PCT Pub. Date: Aug. 8, 2013

(65) Prior Publication Data
US 2014/0369087 A1 Dec. 18, 2014

(30) Foreign Application Priority Data
Feb. 3, 2012 (EP) .................................... 12153782

(51) Int. Cl.
*G01R 23/02* (2006.01)
*G01R 25/00* (2006.01)
(Continued)

(52) U.S. Cl.
CPC .............. *G01R 23/02* (2013.01); *G01R 25/00* (2013.01); *H02J 3/386* (2013.01); *H02M 5/42* (2013.01); *Y02E 10/763* (2013.01)

(58) Field of Classification Search
CPC ......... G01R 23/02; G01R 25/00; H02J 3/386; H02M 5/42; Y02E 10/763
(Continued)

(56) References Cited

U.S. PATENT DOCUMENTS 7,940,131 B2  5/2011  Weng et al.
8,084,874 B2 * 12/2011  Llorente Gonzalez .............. F03D 7/0224
290/44

(Continued)

FOREIGN PATENT DOCUMENTS

CN  102221639 A  10/2011

OTHER PUBLICATIONS

Chinese Office Action dated Feb. 1, 2016; Application No. 201380007671.4; Siemens Aktiengesellschaft; 24 PGS.
(Continued)

*Primary Examiner* — John H Le
(74) *Attorney, Agent, or Firm* — Schmeiser Olsen & Watts LLP

(57) ABSTRACT

A method and an apparatus for determining a phase and a frequency of an electric quantity being associated with an operation of an electrical device are described. The method comprises extracting a fundamental component of the electric quantity, calculating a positive sequence component of the electric quantity based on the extracted fundamental component, and determining the phase and the frequency of the electric quantity based on the calculated positive sequence component.

11 Claims, 2 Drawing Sheets

(51) Int. Cl.
*H02M 5/42* (2006.01)
*H02J 3/38* (2006.01)

(58) Field of Classification Search
USPC ............. 702/75; 324/76.77; 331/44; 363/37; 290/44
See application file for complete search history.

(56) References Cited

U.S. PATENT DOCUMENTS

| | | |
|---|---|---|
| 2009/0015339 A1 | 1/2009 | Weng et al. |
| 2011/0199072 A1 | 8/2011 | Kerkman et al. |
| 2013/0010505 A1 | 1/2013 | Bo et al. |

OTHER PUBLICATIONS

Fatu M. et al.: "Voltage sags ride-through of motion sensorless controlled PMSG for wind turbines"; Industry Applications Conference, 2007, 42nd IAS Annual Meeting, Conference Record of the 2007 IEEE, IEEE, PI; pp. 171-178; ISBN: 978-1-4244-1259-4; XP031145925; Sep. 1, 2007.

Lie Xu et al.: "Dynamic Modeling and Control of DFIG-based Wind Turbnines under unbalanced Network Conditions"; IEEE Transactions on Power Systems, IEEE Service Center, Piscatway, NJ; vol. 22; No. 1; pp. 314-323; ISSN: 0885-8950; XP011161662; US; Feb. 1, 2007.

Choudhury Satish et al.:"Performance Analysis of Doubly-fed Induction Generator in Wind Energy Conversion System"; NIT Rourkela; XP055031219; Jun. 6, 2011.

Aguilar D. et al.: "Sensorless Controll of PMSG-based Wind Energy Conversion System using a FLL-based Synchronization Technique"; IECON 2011—37th Annual Conference on IEEE Industrial Electronics Society, IEEE; pp. 3203-3208; ISBN: 978-1-61284-969-0; DOI: 10.1109/IECON.2011.6119823; XP032104977; Nov. 7, 2011.

PCT/EP2013/052066 International Search Report and Written Opinion. dated: Apr. 24, 2013; Siemens Aktiengesellschaft; 14 pages.

Extended European Search Report for European Application No. 12153782.3, dated Jul. 6, 2012.

* cited by examiner

DETERMINING A PHASE AND A FREQUENCY OF AN ELECTRIC QUANTITY OF AN OPERATING ELECTRICAL DEVICE

CROSS-REFERENCE TO RELATED APPLICATIONS

This application claims priority to PCT Application No. PCT/EP2013/052066, having a filing date of Feb. 1, 2013, based off of EP Application No. 12153782.3, having a filing date of Feb. 3, 2012, the entire contents of which are hereby incorporated by reference.

FIELD OF TECHNOLOGY

The following relates to the technical field of controlling electrical devices, such as an electrical machine or a power grid. In particular, the following relates to a method for determining a phase and a frequency of an electric quantity being associated with an operation of an electrical device. Further, the following relates to an apparatus for determining a phase and a frequency of an electric quantity being associated with an operation of an electrical device. Furthermore, the following relates to a frequency converter for electrically connecting an electric power generating machine. Moreover, the following relates to a wind turbine comprising such an apparatus and to a computer program configured for determining a phase and a frequency of an electric quantity being associated with an operation of an electrical device.

BACKGROUND

When controlling an operation of an electrical device, an actual phase and an actual frequency of an electric quantity being associated with the operation of the electrical device may be important control parameters. For example, a rotor position and/or a rotor speed may be important parameters for controlling the operation of an electrical machine.

In particular, for a vector control of the electrical machine the rotor speed and the rotor position typically need to be determined. For example, the rotor position and the rotor speed may be determined by an encoder or by an estimator.

An encoder may be a hardware sensor which generates pulses when the electrical machine may be rotating. Based on a period between the pulses, the rotor position and the rotor speed can be calculated. Particularly, encoders are often widely used in electrical generators of wind turbines.

An estimator may estimate the rotor position and the rotor speed based on a model of the electrical machine by using measured electrical quantities of the electrical machine. For example, an estimator may be implemented in an inverter software of the electrical machine. An advantage of the estimator may be that it may merely be realized as software. Furthermore, the estimator may have lower maintenance costs and may be more reliable than the encoder.

However, the measured electrical quantities of the electrical machine may comprise higher harmonic components due to production tolerances and/or a design of the electrical machine. The estimator may be designed based on the assumption that the measured electrical quantities have ideal waveforms, for example sinusoidal waveforms. The higher harmonic components of the measured electrical quantities of the electrical machine may affect the accuracy of the rotor position and rotor speed estimation. In particular, an error of in the determined rotor position and rotor speed can significantly affect an efficiency of the electrical machine, for example a generator or a converter.

There may be a need to provide a better determination of a phase and of a frequency of an electric quantity being associated with an operation of an electrical device.

SUMMARY

According to invention disclosed aspect, a method for determining a phase and a frequency of an electric quantity being associated with an operation of an electrical device is provided. The method comprises extracting a fundamental component of the electric quantity, calculating a positive sequence component of the electric quantity based on the extracted fundamental component, and determining the phase and the frequency of the electric quantity based on the calculated positive sequence component.

The electrical device may be a power grid or an electrical machine, for example an electrical generator or an electrical motor. Further, the electrical device may be a generator of a wind turbine. In particular, the electrical device may be an induction generator or a permanent magnet generator.

In particular, the electric quantity being associated with the operation of the electrical device may be a current and/or a voltage. For example, the electric quantity may be a generator current and/or a generator voltage. Further, the electric quantity may be a voltage of a power grid and/or a current of a power grid. More particularly, the electric quantity potentially being associated with the operation of the electrical device may be an electric quantity which may be indicative for a voltage and/or current in a generator or a power grid. Furthermore, the electric quantity may have a periodic waveform, for example a sinusoidal waveform. The electric quantity may be directly and/or indirectly measurable by a suitable sensor. However, due to switching procedure in the electrical device and design of electrical device the electric quantity may have additional harmonic components.

In case that the electrical device is a power grid, the phase of the electric quantity may be indicative for a phase of the voltage in the power grid and the frequency of the electric quantity may be indicative for a frequency of the voltage in the power grid. In case that the electrical device is an electrical machine, the phase of the electric quantity may be indicative for a phase of a rotor of the electrical machine and the frequency of the electric quantity may be indicative for a frequency of the rotor of the electrical machine. Furthermore, the phase of the rotor may be indicative for a rotor angle and the frequency of the rotor may be indicative for a speed of the rotor.

In particular, the fundamental component may be a fundamental frequency of a periodic waveform. The fundamental frequency may be the lowest frequency of the periodic waveform. The fundamental component may be extracted from the electric quantity by means of a Fourier analyses and/or an electronic filter procedure. The electronic filter procedures may be an analog filter procedure and/or a digital filter procedure.

In the analysis of three-phase electrical power systems, the concept of symmetrical components may be used. The three-phase electrical power system may be expressed by a positive sequence component, a negative sequence component and a zero sequence component. The positive sequence component may describe a system or field which rotates in the same direction as the original three-phase electrical power system. The negative sequence component may describe a system or field which rotates in the opposite direction compared to the rotational direction of the original three-phase electrical power system, and the zero sequence component may describe a system or field that oscillates but does not rotate.

The advantage of the described method may be that an encoder can be omitted. This may reduce a cost of the electrical device. Furthermore, the described method may allow for a robust determination of a phase and a frequency of an electric quantity potentially being associated with an operation of an electrical device. This may provide the advantage that a vector control of an electrical machine can be improved. The described method may be implementable without any additional costs and/or without any change of hardware requirements of available electrical devices. The described method may allow for a more precise determination of the phase and the frequency of the electric quantity being associated with the operation of the electrical machine over a wide range of frequencies. Further, the described method may allow for a release of requirements for a generator design.

According to an embodiment the electrical device may be a power grid.

In case that the electrical device may be a power grid, the phase of the electric quantity may be indicative for a phase of an electrical power or an electrical voltage in the power grid and the frequency of the electric quantity may be indicative for a frequency of the electrical power or an electrical voltage in the power grid. In particular, the electric quantity may be a grid voltage. A matching of a power station, e.g. a wind power station, to the power grid may be improved by precise knowledge of the phase and the frequency of the power grid. This may allow for a more effective power coupling between the power station and the power grid.

According to a further embodiment the electrical device may be an electrical machine.

The electrical machine may be an electrical generator or an electrical motor. An electrical machine may comprise a rotor with at least one rotor coil and/or a stator with at least one stator coil. Further, the electrical device may be a generator of a wind turbine. In particular, the electrical device may be an induction generator or a permanent magnet generator. The described method may provide the advantage that a control of the electrical machine may be improved. In particular, for an efficient control of the electrical machine a precise knowledge of the electrical angle and the speed of a rotor of the electrical machine may be necessary. It may also be possible to use the described method for estimating an electrical angle and a speed of a rotor of an electrical motor. In particular, the phase of the electric quantity may be indicative for the electrical angle and the frequency of the electric quantity may be indicative for the speed of the rotor.

According to a further embodiment the electric quantity may be a counter electromotive force.

The counter electromotive force, which may also be called a back electromotive force, may be an electromotive force which pushes against the current which induces it. The counter electromotive force may be caused by a changing electromagnetic field. In particular, the counter electromotive force may allow for an indirect measurement of a quantity associated with the operation of the electric device, for example a generator voltage of a wind turbine generator. An indirect measurement of the counter electromotive force may provide the advantage that a perturbation of the measured system may only be small.

According to a further embodiment, the method may further comprise determining the counter electromotive force by means of a Kalman filter.

In particular, the Kalman filter may allow for an efficient determining of the counter electromotive force. Moreover, the counter electromotive force may be determined in a stationary abc frame. The counter electromotive force may as well be determined in a so called αβ frame. The αβ frame may allow a simplified calculation based on only two parameters as compared to the abc frame based on three parameters. The abc frame and the αβ frame may be connected by Clarke transformation.

According to a further embodiment, the method may further comprise determining the counter electromotive force by means of an observer.

In particular, the observer may allow for an indirect determining of the counter electromotive force. The observer may determine the counter electromotive force in the abc frame or in the αβ frame.

According to a further embodiment a fundamental component may be extracted by means of an adaptive band pass filter and/or a low pass filter. This may provide the advantage that the fundamental component may be determined in a simple and robust manner.

According to a further embodiment calculating the positive sequence component may comprise obtaining a phase shifted component which has a 90 degree phase shift to the extracted fundamental component.

The extracted fundamental component may be transformed into the αβ frame by Clarke transformation before calculating the positive sequence component. In particular, the fundamental component in αβ frame may be given by vector components $V_{\alpha 1}$ and $V_{\beta 1}$. The phase shifted component which has a 90 degree phase shift to the extracted fundamental component $V_{\alpha 1}$ and $V_{\beta 1}$ may be given by $V'_{\alpha 1}$ and $V'_{\beta 1}$. Furthermore, there may be a gain difference between the fundamental components $V_{\alpha 1}$, $V_{\beta 1}$ and the phase shifted components $V'_{\alpha 1}$, $V'_{\beta 1}$. In particular, a gain may be determined based on the determined frequency of the electric quantity. The positive sequence component in αβ frame may be given by $$V^+_{\alpha 1} = 0.5 * (V_{\alpha 1} - V'_{\beta 1})$$

$$V^+_{\beta 1} = 0.5 * (V'_{\alpha 1} + V_{\beta 1}).$$

This may provide the advantage that the positive sequence component may be calculated in a simple and efficient manner.

According to a further embodiment the phase and the frequency of the electric quantity may be determined by means of a Phase Lock Loop.

A Phase Lock Loop may provide an efficient and robust way for determining a phase and a frequency of a signal. In a case that the electrical device may be an electrical generator, the phase and the frequency of the electric quantity, e.g. the counter electromotive force, may be proportional to a rotor phase and a rotor frequency.

According to a further aspect an apparatus for determining a phase and a frequency of an electric quantity being associated with an operation of an electrical device may be provided. The apparatus may comprise an extracting unit possibly configured for extracting a fundamental component of the electric quantity, a calculating unit possibly configured for calculating a positive sequence component of the electric quantity possibly based on the extracted fundamental component, and a determining unit possibly configured for determining the phase and the frequency of the electric quantity possibly based on the calculated positive sequence component.

In particular, the determining unit may comprise a Phase Lock Loop. More particularly, the Phase Lock Loop may comprise a proportional-integral controller which may determine a bandwidth of the determining unit. More particularly, the extracting unit, the calculating unit, and the determining unit may also be realized as a single unit. Moreover, the described apparatus may be implemented in a controller of the electrical device.

According to a further embodiment the apparatus may further comprise a further determining unit possibly configured for determining a counter electromotive force possibly being associated with the electrical device.

As has already been mentioned above, determining the counter electromotive force may allow for an indirect measurement of a quantity associated with the operation of the electric device, for example a generator voltage of a wind turbine generator. An indirect measurement of the counter electromotive force may provide the advantage that a perturbation of the measured system may only be small.

According to a further aspect there may be provided a frequency converter for electrically connecting an electric power generating machine, in particular, and for example, a generator of a wind turbine, with a power grid. The frequency converter may comprise an AC-to-DC stage for converting a first AC power signal possibly being generated by the electric power generating machine into a DC power signal, a DC-to-AC stage for converting the DC power signal into a second AC power signal possibly being received from the power grid, and the above described apparatus, wherein the apparatus may be assigned to the AC-to-DC stage or to the DC-to-AC stage.

The apparatus may be assigned to the AC-to-DC stage or to the DC-to-AC stage by a switch. The described frequency converter may provide the advantage that it may allow for an efficient determining of a phase and a frequency of the power grid and/or the generator. When the apparatus may be assigned to the AC-to-DC stage, the apparatus may determine a phase and a frequency of an electric quantity being associated with an operation of the electric power generating machine. Further, when the apparatus may be assigned to the DC-to-AC stage, the apparatus may determine a phase and a frequency of an electric quantity being associated with the power grid.

According to a further aspect a wind turbine may be provided. The wind turbine may comprise the above described frequency converter.

The frequency converter may determine the phase and the frequency of the generator of the wind turbine. Further, the determined phase and frequency of the generator may be sent to a generator controller which may regulate a rotor frequency of the generator.

According to a further aspect a computer program for determining a phase and a frequency of an electric quantity being associated with an operation of an electrical device may be provided, wherein the computer program, when executed by a processor, may be adapted to, inter alia, perform the above described methodology.

As used herein, a reference to a computer program may be equivalent to a reference to a program element and/or to a computer readable medium containing instructions for controlling a computer system to coordinate the performance of the above described methodology.

The computer program may be implemented as computer readable instruction code in any suitable programming language, such as, for example, JAVA, C++, and may be stored on a computer-readable medium (such as, for example, a removable disk, a volatile or non-volatile memory, an embedded memory/processor, etc.). The instruction code may be operable to program a computer or any other programmable device to carry out the intended functions. The computer program may be available from a network, such as the World Wide Web, from which it may be downloaded.

The described embodiment(s) may be realized by means of a computer program, respectively software. However, the described embodiment(s) may also be realized by means of one or more specific electronic circuits, respectively hardware. Furthermore, the described embodiment(s) may also be realized in a hybrid form, i.e. in a combination of software modules and hardware modules.

In particular, the computer program may be stored on a computer-readable medium. The computer-readable medium may be readable by a computer or a processor. The computer-readable medium may be, for example but not limited to, an electric, magnetic, optical, infrared or semiconductor system, device or transmission medium. The computer-readable medium may include at least one of the following media: a computer-distributable medium, a program storage medium, a record medium, a computer-readable memory, a random access memory, an erasable programmable read-only memory, a computer-readable software distribution package, a computer-readable signal, a computer-readable telecommunications signal, computer-readable printed matter, and a computer-readable compressed software package.

Embodiments have been described with reference to different subject matters. In particular, some embodiments have been described with reference to method and function whereas other embodiments have been described with reference to apparatus and structure. However, a person skilled in the art will gather from the above and the following description that, unless other notified, in addition to any combination of features belonging to one type of subject matter also any combination between features relating to different subject matters, in particular between features of the method and function and features of the apparatus and structure may be considered as to be disclosed with this document.

The aspects defined above and further aspects are apparent from the examples of embodiments to be described hereinafter and are explained with reference to the examples of embodiments. The embodiments will be described in more detail hereinafter with reference to examples of the embodiments but to which the embodiments are not limited.

BRIEF DESCRIPTION

Some of the embodiments will be described in detail, with reference to the following figures, wherein like designations denote like members, wherein.

DETAILED DESCRIPTION

Figure 1:
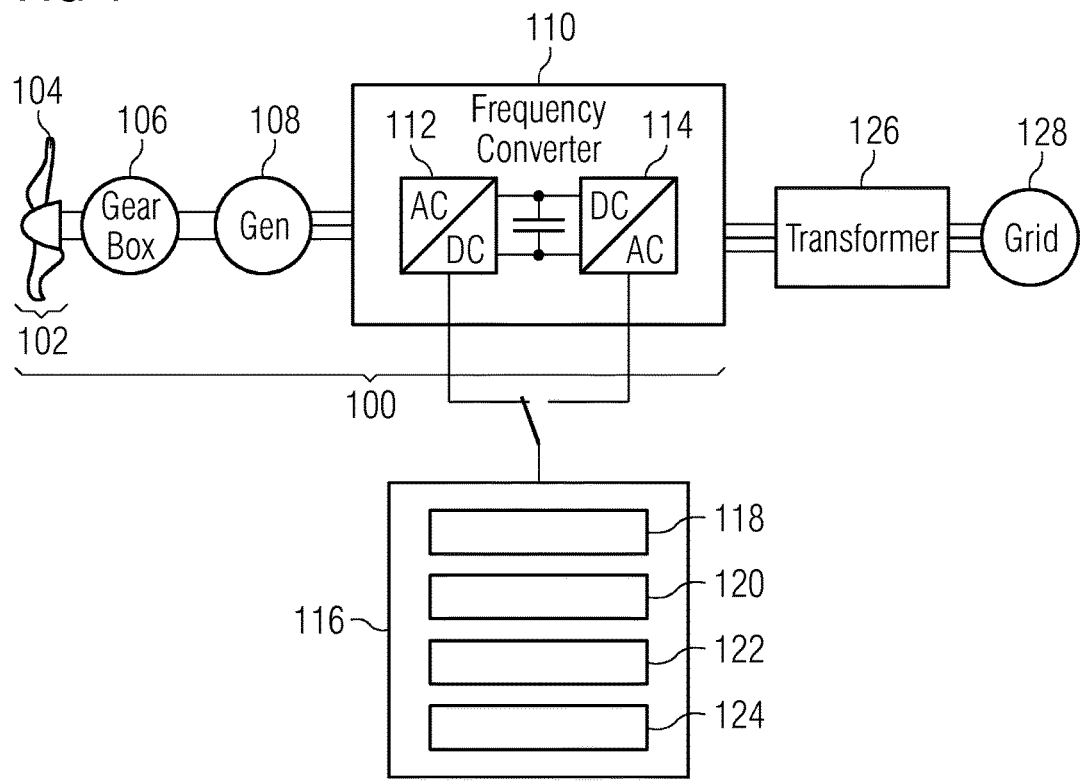
FIG. 1 shows a perspective view of a wind turbine comprising a frequency converter and an apparatus according to exemplary embodiments.

The illustration in the drawings are schematically. It is noted that in different figures, similar or identical elements are often provided with the same reference signs or with reference signs, which are different from the corresponding reference signs only within the first digit.

FIG. 1 shows a wind turbine 100 according to an exemplary aspect. The wind turbine 100 comprises a rotor 102 with rotor blades 104. The rotor 102 may be connected to a generator 108 by a gear box 106. However, in case that the wind turbine 100 may be a direct drive wind turbine the gear box 106 may be omitted.

The generator 108 of the wind turbine 100 may be electrically connected with a power grid 128 by a frequency converter 110 and a transformer 126. The frequency converter comprises an AC-to-DC stage 112 for converting a first AC power signal being generated by the generator 108 into a DC power signal. The frequency converter 110 further comprises a DC-to-AC stage 114 for converting the DC power signal into a second AC power signal being received from the power grid 128 via a transformer 126. Furthermore, the frequency converter 110 comprises an apparatus 116 for determining a phase and a frequency of an electric quantity being associated with an operation of an electrical device. The apparatus 116 may either be assigned to the AC-to-DC stage 112 or to the DC-to-AC stage 114. In particular, the apparatus 116 may determine a phase θ and a frequency ω of an electric quantity being associated with an operation of the generator 108 when assigned to the AC-to-DC stage 112. Further, the apparatus 116 may determine a phase θ and a frequency ω of the power grid 128 when assigned to the DC-to-AC stage 114.

The apparatus 116 comprises an extracting unit 118 configured for extracting a fundamental component $V_{\alpha 1}$, $V_{\beta 1}$ of the electric quantity. Further, the apparatus 116 comprises a calculating unit 120 configured for calculating a positive sequence component $V^+_{\alpha 1}$ and $V^+_{\beta 1}$ of the electric quantity based on the extracted fundamental components $V_{\alpha 1}$ and $V_{\beta 1}$. The apparatus 116 also comprises a determining unit 122 configured for determining the phase θ and the frequency ω of the electric quantity based on the calculated positive sequence components $V^+_{\alpha 1}$ and $V^+_{\beta 1}$. Furthermore, the apparatus comprises a further determining unit 124 configured for determining a counter electromotive force $V_\alpha$, $V_\beta$ being associated with the electrical device.

Figure 2:
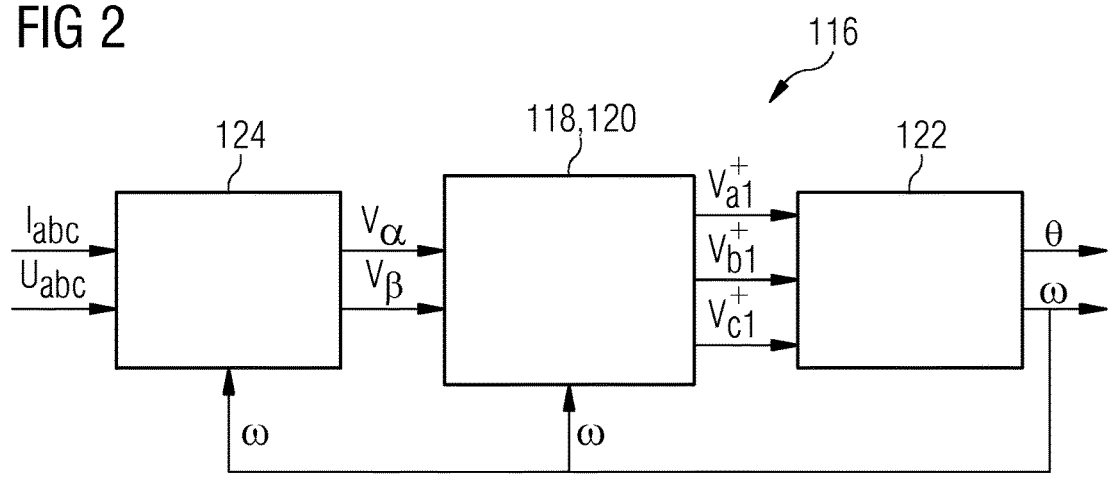
FIG. 2 shows a perspective view of an underlying control architecture of the apparatus shown in FIG. 1.

FIG. 2 shows an underlying control architecture of the apparatus 116 according to an exemplary embodiment. $I_{abc}$ and $U_{abc}$ represent the electric quantity being associated with an operation of an electrical device, namely the generator current $I_{abc}$ and the generator Voltage $U_{abc}$. For example, the generator voltage may be measured by a coil which may be arranged at a stator of the generator 108. Another option for obtaining the generator voltage $U_{abc}$ may be to calculate the generator voltage $U_{abc}$ from internal control variables of the frequency converter 110.

In particular, when a pulse width modulation switching is enabled in a generator controller of the wind turbine 100, the generator voltage $U_{abc}$ and/or the generator current $I_{abc}$ may comprise high-frequency harmonic components. This may be overcome be obtaining an average voltage value and/or an average current value using a sampling procedure of the generator voltage $U_{abc}$ and/or the generator current $I_{abc}$, respectively. Furthermore, it may also be possible to remove high-frequency harmonics on the generator voltage and/or on the generator current by means of analog and/or digital filters.

The further determining unit 124 may be configured for determining a counter electromotive force being associated with generator voltage $U_{abc}$ and/or the generator current $I_{abc}$ by means of an observer or a Kalman filter. The determined counter electromotive force may then be transformed by a Clarke transformation from the abc frame into the αβ frame. The transformed counter electromotive force components $V_{\alpha 1}$, $V_{\beta 1}$ are further processed by the calculating unit 120. The calculating unit 120 may be configured for calculating the positive sequence components $V^+_{\alpha 1}$, $V^+_{\beta 1}$ of the electric quantity based on the counter electromotive force components $V_{\alpha 1}$, $V_{\beta 1}$. The positive sequence components $V^+_{\alpha 1}$, $V^+_{\beta 1}$ are transformed in the abc frame by an inverse Clarke transformation. The positive sequence components $V^+_{a1}$, $V^+_{b1}$, and $V^+_{c1}$ in abc frame are further processed by the determining unit 122 which may be configured for determining the phase θ and the frequency ω of the electric quantity based on the calculated positive sequence components $V^+_{a1}$, $V^+_{b1}$, and $V^+_{c1}$. A feedback loop may be used to provide the further determining unit 124, the determining unit 118 and the calculating unit 120 with the determined frequency ω of the electric quantity in order to improve an accuracy of the determined phase θ and frequency ω.

Figure 3:
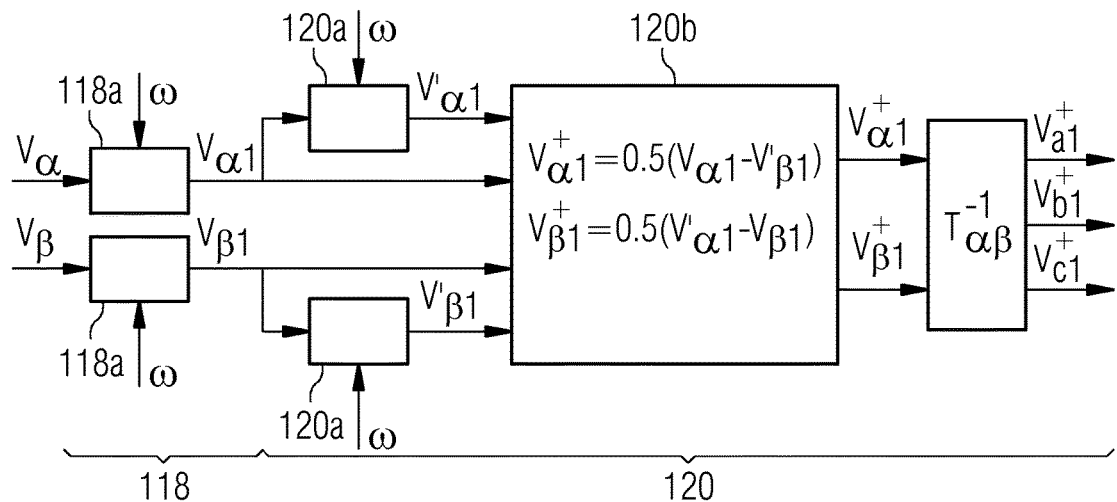
FIG. 3 shows a perspective view of an underlying control architecture of an extracting unit and an calculating unit of an apparatus according to an exemplary embodiment.

FIG. 3 shows an underlying control architecture of the extracting unit 118 and the calculating unit 120 according to an exemplary embodiment. The extracting unit 118 may be configured for extracting fundamental components $V_{\alpha 1}$ and $V_{\beta 1}$ of the counter electromotive force components $V_\alpha$, $V_\beta$ by means of an adaptive band pass filter and/or a low pass filter 118a. As indicated by reference numeral 120a phase shifted components $V'_{\alpha 1}$ and $V'_{\beta 1}$ are obtained, which have a 90 degree phase shift to the extracted fundamental components $V_{\alpha 1}$ and $V_{\beta 1}$. Furthermore, there may be a gain difference between the fundamental components $V_{\alpha 1}$, $V_{\beta 1}$ and the phase shifted components $V'_{\alpha 1}$, $V'_{\beta 1}$. In particular, a gain may be determined based on the determined frequency of the electric quantity. In particular, the unit 120a may be configured to determine the gain based on the determined frequency of the electric quantity.

The calculating unit 120 may be further configured for calculating positive sequence components $V^+_{\alpha 1}$, $V^+_{\beta 1}$ of the electric quantity based on the extracted fundamental components $V_{\alpha 1}$ and $V_{\beta 1}$ and the phase shifted components $V'_{\alpha 1}$ and $V'_{\beta 1}$, as indicated with reference numeral 120b. The positive sequence components $V^+_{\alpha 1}$, $V^+_{\beta 1}$ in αβ frame are given by the equations $$V^+_{\alpha 1}=0.5*(V_{\alpha 1}-V'_{\beta 1})$$

$$V^+_{\beta 1}=0.5*(V'_{\alpha 1}+V_{\beta 1}).$$

The obtained positive sequence components $V^+_{\alpha 1}$, $V^+_{\beta 1}$ are then transformed from the αβ frame into the abc frame by an inverse Clarke transformation $T^{-1}_{\alpha\beta}$.

Figure 4:
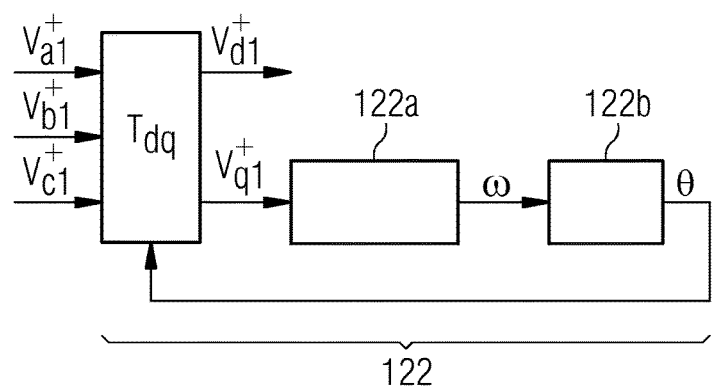
FIG. 4 shows a perspective view of an underlying control architecture of an determining unit of an apparatus according to an exemplary embodiment.

FIG. 4 shows an underlying control architecture of the determining unit 122 according to an exemplary embodiment. The obtained positive sequence components $V^+_{a1}$, $V^+_{b1}$, $V^+_{c1}$ in abc frame are transformed into an dq-frame by a dq transformation or Park transformation $T_{dq}$. The frequency ω and the phase θ of the generator voltage $U_{abc}$ and the generator current $I_{abc}$ are derived from the transformed positive sequence components $V^+_{d1}$, $V^+_{q1}$, as indicated by reference numerals 122a and 122b, for example by means of a phase lock loop.

It should be noted that the term "comprising" does not exclude other elements or steps and the use of articles "a" or "an" does not exclude a plurality. Also elements described in association with different embodiments may be combined. It should also be noted that reference signs in the claims should not be construed as limiting the scope of the claims.

The invention claimed is:

1. A method for determining a phase and a frequency of an electric quantity being associated with an operation of an electrical device, the method comprising:
   providing an electric machine or a power grid;
   providing an AC-to-DC stage for converting a first AC power signal being generated by the electric power machine into a DC power signal;
   providing a DC-to-AC stage for converting the DC power signal into a second AC power signal being received from the power grid;
   extracting a fundamental component of the electric quantity from the electric machine or power grid, wherein the electric quantity is a counter electromotive force;
   calculating a positive sequence component of the counter electromotive force based on the extracted fundamental component of the electric machine or power grid;
   determining the phase and the frequency or oscillation of the counter electromotive force based on the calculated positive sequence component of the electric machine or power grid;
   providing a feedback loop providing the determining unit and the calculating unit with the determined frequency so as to improve an accuracy of the determined phase, frequency or oscillation; and
   performing a change in the phase, the frequency or the oscillation of the electric machine or power grid based upon the determined phase, frequency, or oscillation.

2. The method according to claim 1, further comprising: determining the counter electromotive force by a Kalman filter.

3. The method according to claim 1, further comprising: determining the counter electromotive force by an observer.

4. The method according claim 1, wherein the fundamental component is extracted by an adaptive band pass filter and/or a low pass filter.

5. The method according to claim 1, wherein:
   calculating the positive sequence component comprises obtaining a phase shifted component which has a 90 degree phase shift to the extracted fundamental component.

6. The method according to claim 1, wherein the phase and the frequency of the electric quantity are determined by a Phase Lock Loop.

7. A computer program product, comprising a computer readable hardware storage device having computer readable program code stored therein, said program code executable by a processor of a computer system to implement a method for determining a phase and a frequency of an electric quantity being associated with an operation of an electrical device, wherein the computer program product, when executed by the processor, is adapted to perform a method according to claim 1.

8. An apparatus for determining a phase and a frequency of an electric quantity being associated with an operation of an electrical device, the apparatus comprising:
   an extracting unit configured for extracting a fundamental component of the electric quantity;
   a calculating unit configured for calculating a positive sequence component of the electric quantity based on the extracted fundamental component;
   a determining unit configured for determining the phase and the frequency of the electric quantity based on the calculated positive sequence component;
   an AC-to-DC stage for converting a first AC power signal being generated by an electric power generating machine into a DC power signal;
   a DC-to-AC stage for converting the DC power signal into a second AC power signal being received from a power grid; and
   a feedback loop providing the determining unit and the calculating unit with the determined frequency so as to improve an accuracy of the determined phase and frequency.

9. The apparatus according to claim 8, further comprising:
   a further determining unit configured for determining the electric quantity, wherein the electric quantity is a counter electromotive force being associated with the electrical device.

10. The apparatus of claim 8, wherein the electrical device is a generator of a wind turbine or a power grid.

11. A wind turbine comprising:
   a frequency converter as set forth in claim 10.

* * * * *